(12) United States Patent
Quax et al.

(10) Patent No.: US 9,704,850 B2
(45) Date of Patent: Jul. 11, 2017

(54) ELECTROSTATIC DISCHARGE PROTECTION DEVICE COMPRISING A SILICON CONTROLLED RECTIFIER

(71) Applicant: NXP B.V., Eindhoven (NL)

(72) Inventors: Guido Wouter Willem Quax, Utrecht (NL); Da-Wei Lai, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/177,858

(22) Filed: Jun. 9, 2016

(65) Prior Publication Data

US 2017/0012036 A1    Jan. 12, 2017

(30) Foreign Application Priority Data

Jul. 10, 2015 (EP) .................................... 15176256

(51) Int. Cl.
*H01L 27/02* (2006.01)
*H01L 29/87* (2006.01)
*H01L 23/528* (2006.01)
*H01L 29/06* (2006.01)

(52) U.S. Cl.
CPC ...... *H01L 27/0262* (2013.01); *H01L 23/5286* (2013.01); *H01L 29/0684* (2013.01); *H01L 29/87* (2013.01); *H01L 29/0692* (2013.01)

(58) Field of Classification Search
CPC ............. H01L 27/0262; H01L 27/0248; H01L 23/5286; H01L 29/0684
See application file for complete search history.

(56) References Cited

U.S. PATENT DOCUMENTS

| 5,072,273 | A | 12/1991 | Avery |
| 5,528,188 | A | 6/1996 | Au et al. |
| 5,541,801 | A | 7/1996 | Lee et al. |
| 5,602,404 | A | 2/1997 | Chen et al. |
| 5,734,541 | A | 3/1998 | Iniewski et al. |

(Continued)

FOREIGN PATENT DOCUMENTS

| EP | 1048076 B1 | 1/2007 |
| WO | 2004095521 A2 | 11/2004 |

OTHER PUBLICATIONS

Extended European Search Report for patent application 15176256.4, Dec. 23, 2015, 9 pages.

(Continued)

*Primary Examiner* — Nathan W Ha (57) ABSTRACT

An electrostatic discharge protection device including a silicon controlled rectifier. In one example, the silicon controlled rectifier includes a first n-type region located in a semiconductor substrate. The silicon controlled rectifier also includes a first p-type region located adjacent the first n-type region in the semiconductor substrate. The silicon controlled rectifier further includes an n-type contact region and a p-type contact region located in the first n-type region. The silicon controlled rectifier also includes an n-type contact region and a p-type contact region located in the first p-type region. The silicon controlled rectifier further includes a blocking region having a higher resistivity than the first p-type region. The blocking region is located between the n-type contact region and the p-type contact region in the first p-type region for reducing a trigger voltage of the silicon controlled rectifier.

18 Claims, 6 Drawing Sheets

(56) References Cited

U.S. PATENT DOCUMENTS

| | | | |
|---|---|---|---|
| 5,742,085 | A | 4/1998 | Yu |
| 5,825,600 | A | 10/1998 | Watt |
| 5,856,214 | A | 1/1999 | Yu |
| 5,872,379 | A | 2/1999 | Lee |
| 5,907,462 | A | 5/1999 | Chatterjee et al. |
| 6,242,763 | B1 | 6/2001 | Chen et al. |
| 6,249,414 | B1 | 6/2001 | Lee et al. |
| 6,465,848 | B2 | 10/2002 | Ker et al. |
| 6,560,080 | B1 | 5/2003 | Chen et al. |
| 6,576,959 | B2 | 6/2003 | Kunz et al. |
| 6,690,069 | B1 | 2/2004 | Vashchenko et al. |
| 6,768,619 | B2 | 7/2004 | Ker et al. |
| 6,909,149 | B2 | 6/2005 | Russ et al. |
| 7,518,164 | B2 | 4/2009 | Smelloy et al. |
| 7,719,026 | B2 | 5/2010 | Lou et al. |
| 7,943,958 | B1 | 5/2011 | Vashchenko |
| 2002/0060345 | A1 | 5/2002 | Yu et al. |
| 2003/0090845 | A1 | 5/2003 | Ker et al. |
| 2004/0207021 | A1 | 10/2004 | Russ et al. |
| 2005/0151160 | A1 | 7/2005 | Salcedo et al. |
| 2006/0170054 | A1 | 8/2006 | Mergens et al. |
| 2010/0244187 | A1* | 9/2010 | Voldman ............... H01L 23/481 257/531 |
| 2011/0204415 | A1 | 8/2011 | Wijmeersch et al. |
| 2012/0161232 | A1* | 6/2012 | Farbiz ................ H01L 27/0255 257/337 |
| 2013/0009204 | A1* | 1/2013 | Song .................. H01L 27/0262 257/119 |
| 2013/0208379 | A1 | 8/2013 | Wang et al. |
| 2014/0138735 | A1* | 5/2014 | Clarke ............... H01L 29/0692 257/124 |
| 2014/0167106 | A1* | 6/2014 | Salcedo ................ H01L 29/78 257/146 |
| 2014/0367830 | A1* | 12/2014 | Zhan .................. H01L 27/0262 257/577 |

OTHER PUBLICATIONS

Ker et al., "Implementation of Initial-on ESD protection concept with PMOS-triggered SCR devices in deep-submicron CMOS technology", IEEE J. of solid-state circuits, vol. 42 (5), 2007, p. 1158.

Ker et al., "Native-NMOS-triggered SCR with faster turn-on speed for effective ESD protection in a 0.13 um CMOS process", IEEE Trans. on dev. and mat. reliability, vol. 5 (3), 2005, p. 543.

Ker et al., "Overview of on-chip electrostatic discharge protection design with SCR-based devices in CMOS integrated circuits", IEEE Trans. on dev. and mat. reliability, vol. 5 (2), 2005, p. 235.

Ker et al., "SCR device with dynamic holding voltage for on-chip ESD protection in a 0.25-um fully salicided CMOS process", IEEE Trans. on electron devices, vol. 51 (10), 2004, p. 1731.

Ker et al., "Latchup-free ESD protection design with complementary substrate-triggered SCR devices", IEEE J. of Solid-state circuits, vol. 38 (8), 2003, p. 1380-1392.

Ker et al., "Complementary substrate-triggered SCR devices for on-chip ESD protection circuits", 15th Ann. IEEE Int. ASIC/SOC conference, 2002, p. 229-233.

Ker et al., "On-chip ESD protection circuit design with novel substrate-triggered SCR device in sub-quarter-micron CMOS process", IEEE Symp. on circuits and systems (ISCAS 2002), 2002, p. V-529.

Mergens et al., "High holding current SCRs (HHI-SCR) for ESD protection and latch-up immune IC operation", Proc. EOS/ESD symp. 2002 (paper 1A3).

Russ et al., "GGSCRs: GGNMOS triggered silicon controlled rectifiers for ESD protection in deep sub-micron CMOS processes", Proc. EOS/ESD symp. 2001.

Ker et al., "A gate-coupled PTLSCR/NTLSCR ESD protection circuit for deep-submicron low-voltage CMOS IC's", IEEE Journal of solid-state circuits, 1997, vol. 32 (1), p. 38.

Ker et al., "Capacitor-couple ESD protection circuit for deep-submicron low-voltage CMOS ASIC", IEEE Trans. on VLSI systems, vol. 4 (3), 1996, p. 307.

Watt et al., "A hot-carrier triggered SCR for smart power bus ESD protection", International Electron Devices Meeting (IEDM 95), 1995, p. 341-344.

Duvvury et al., "A synthesis of ESD input protection scheme", Proceeding of EOS/ESD symposium, 1991, p. 88-97.

Chatterjee et al., 'A low-voltage trigger SCR for on-chip ESD protection at output and input pads', IEEE Electr. Dev. Letters, vol. 12 (1), 1991, p. 21-22.

* cited by examiner

ELECTROSTATIC DISCHARGE PROTECTION DEVICE COMPRISING A SILICON CONTROLLED RECTIFIER

CROSS-REFERENCE TO RELATED APPLICATIONS

This application claims priority under 35 U.S.C. §119 to European Patent application no. 15176256.4, filed on 10 Jul. 2015, the contents of which are incorporated by reference herein.

FIELD OF THE INVENTION

This invention relates to an electrostatic discharge protection device comprising a silicon controlled rectifier.

BACKGROUND OF THE INVENTION

Integrated circuits generally include an electrostatic discharge (ESD) device for shunting currents which occur during the manufacturing process (e.g. due to discharging of a charged human body ('human body model', or 'HBM')). In pad-based ESD designs, in particular, the ESD protection is usually placed locally, and is connected to the drains of an output stage MOS. During an ESD event, current shunting occurs after a trigger voltage across the ESD device has been reached. When the ESD device triggers, its voltage drops to a holding voltage. The trigger voltage of the ESD device should therefore be above a maximum operating voltage of the product.

A challenge related to pad-based ESD design is that the ESD protection device often has a higher trigger voltage than the trigger voltage of a driver MOS device to be protected. Triggering of the MOS devices may thus occur earlier than triggering of the ESD device when the gate voltage of the driver MOS is uncontrolled and unknown during an ESD event. An early trigger of the MOS device is unwanted because it may lead to immediate failure.

Silicon controlled rectifiers are often used as an ESD protection device for pad-based ESD protection. The current shunting capacity per unit of area of SCR's is typically superior to that of gate-grounded NMOS (ggNMOS) devices. However, traditional SCR designs typically have a trigger voltage that is too high to be usable in many designs.

Furthermore, an SCR typically has low holding voltage (i.e. the voltage at which the current shunting mode operates, after triggering the SCR), which can lead to latch-up during testing or thereafter when an ESD event occurs. Latch-up generally leads to device failure.

Various approaches have been taken in the past for tuning the trigger and holding voltages of an SCR, leads to designs including Medium Voltage Silicon Controlled Rectifiers (MVSCRs) and Low Voltage Silicon Controlled Rectifiers (LVSCRs).

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an electrostatic discharge protection device comprising a silicon controlled rectifier, the silicon controlled rectifier comprising:

a region having a first conductivity type located in a semiconductor substrate;

a region having a second conductivity type located adjacent the region having the first conductivity type in the semiconductor substrate;

a contact region of the first conductivity type and a contact region of the second conductivity type located in the region having the first conductivity type;

a contact region of the first conductivity type and a contact region of the second conductivity type located in the region having the second conductivity type, and a blocking region having a higher resistivity than the region having the second conductivity type, wherein the blocking region is located between the contact region of the first conductivity type and the contact region of the second conductivity type in the region having the second conductivity type, for reducing a trigger voltage of the silicon controlled rectifier.

The provision of the blocking region having a higher resistivity than the region having the second conductivity type may reduce the trigger voltage of the silicon controlled rectifier. In some examples the reduced trigger voltage may allow the silicon controlled rectifier to trigger before triggering of a device (e.g. an output stage MOS) that the ESD protection device is intended to protect. This may avoid failure of the protected device during an ESD event. Accordingly, the reduced trigger voltage that may be provided by the blocking region may allow the device to be used in a wider range of applications (e.g. for applications that require ESD protection for smaller output stage MOS devices).

The device may include a further region having the first conductivity type located adjacent the region having the second conductivity type in the semiconductor substrate. A contact region of the first conductivity type and a contact region of the second conductivity type may be located in the further region having the first conductivity type. This arrangement may allow the failure current of the device (It2) to be increased.

The device may be connected to provide ESD protection that, during an ESD event, may shunt an ESD current from a first node (which may be a power supply rail or I/O pad of the device) to a second node (which may be a ground rail of the device).

In one example, the contact region of the first conductivity type and the contact region of the second conductivity type located in the region having the first conductivity type are connected to a first node of the device. The contact region of the first conductivity type and the contact region of the second conductivity type located in the further region having the first conductivity type may also be connected to the first node. In this way, an ESD current may be received by the silicon controlled rectifier for shunting the current away from a device under protection. The contact region of the first conductivity type and the contact region of the second conductivity type located in the region having the second conductivity type may be connected to a second node of the device, e.g. to allow the ESD current to be shunted to ground.

The device may include a further contact region of the first conductivity type located in the region having the second conductivity type. The contact region of the first conductivity type and the further contact region of the first conductivity type located in the region having the second conductivity type may collectively form a bipolar transistor (e.g. npn) within the region having the second conductivity type. A gate may be provided for applying a potential to a portion of the region having the second conductivity type located in-between the contact region of the first conductivity type and the further contact region of the first conductivity type. The gate may be connected to a slew rate detection circuit. In another example, the gate may be connected to the second node of the device.

The device may include a layer having the first conductivity type extending beneath the region having the second conductivity type in the substrate for isolating the region having the second conductivity type from an underlying region of the substrate. The layer may be in contact with the region(s) having the first conductivity type and may provide a current path between them.

In some examples, certain characteristics of the blocking region may be selected for tuning the trigger voltage and/or holding voltage of the silicon controlled rectifier. For instance, the resistivity of the blocking region may be selected according to a desired trigger voltage. The resistivity of the blocking region may be selected by selecting a doping level of the blocking region. For example the blocking region may be undoped and/or may have a lower doping level than the region having the second conductivity type. As described in more detail below, the blocking region may be pinched/narrowed by the layer having the first conductivity type located beneath it in the substrate. The shape/dimensions of the blocking region may also be selected according to the desired trigger voltage. For instance a dimension of the blocking region extending between the contact region of the first conductivity type and the contact region of the second conductivity type in the region having the second conductivity type may be in the range $1~\mu m \leq W \leq 2~\mu m$.

The first conductivity type and the second conductivity type are different conductivity types. Accordingly, the first conductivity type may be n-type and the second conductivity type may be p-type. Nevertheless, it is also envisaged that the first conductivity type may be p-type and the second conductivity type may be n-type. It is envisaged that the substrate may have the second conductivity type.

According to an aspect of the invention, there is provided an electrostatic discharge protection device comprising a silicon controlled rectifier, the silicon controlled rectifier comprising:

a first n-type region located in a semiconductor substrate;

a first p-type region located adjacent the first n-type region in the semiconductor substrate;

an n-type contact region and a p-type contact region located in the first n-type region;

an n-type contact region and a p-type contact region located in the first p-type region, and a blocking region having a higher resistivity than the first p-type region, wherein the blocking region is located between the n-type contact region and the p-type contact region in the first p-type region for reducing a trigger voltage of the silicon controlled rectifier.

According to another aspect of the invention, there is provided an electrostatic discharge protection circuit including an electrostatic discharge protection device of the kind described above.

According to a further aspect of the invention, there is provided an integrated circuit including an electrostatic discharge protection circuit of the kind described above.

BRIEF DESCRIPTION OF THE DRAWINGS

Embodiments of the present disclosure will be described hereinafter, by way of example only, with reference to the accompanying drawings in which like reference signs relate to like elements and in which.

DETAILED DESCRIPTION

Embodiments of the present disclosure are described in the following with reference to the accompanying drawings.

Embodiments of this disclosure may provide an electrostatic discharge (ESD) protection device that comprises a silicon controlled rectifier (SCR). The device can be provided in a semiconductor substrate, such as a silicon substrate.

The following embodiments are described in the context of devices for which the first conductivity type is n-type and the second conductivity type is p-type. Nevertheless, as noted above, it is envisaged that the first conductivity type may be p-type and the second conductivity type may be n-type.

The device includes region having a first conductivity type (in the examples described below, a first n-type region) located in the substrate. The device includes region having a second conductivity type (in the examples described below, a first p-type region), which is also located in the substrate. The region having the second conductivity type may be located adjacent the region having the first conductivity type in the substrate. Contact regions of the first and second conductivity type may be provided for each region. The contact regions may be more highly doped ($n^+$, $p^+$) than the n regions in which they are located.

The device further includes a blocking region. The blocking region may be located between a contact region of the first conductivity type and a contact region of the second conductivity type in the region having the second conductivity type. The blocking region may have a resistivity that is higher than the resistivity of the surrounding region having the second conductivity type. As will be explained in more detail below, the provision of the blocking region between the contact regions in the region having the second conductivity type may reduce a trigger voltage of the silicon controlled rectifier. Reduction of the trigger voltage may allow an ESD protection device to be used in a wide range of applications, including for instance those that require a lower trigger voltage than may normally be achieved using a conventional silicon controlled rectifier.

Figure 1:
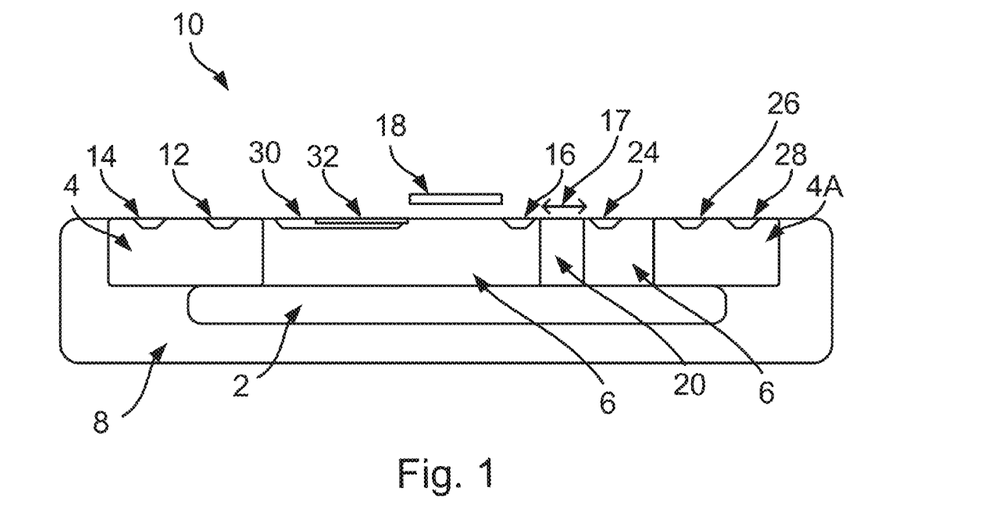
FIG. 1 shows an electrostatic discharge protection device including a silicon controlled rectifier in accordance with an embodiment of the present disclosure.
Figure 4:
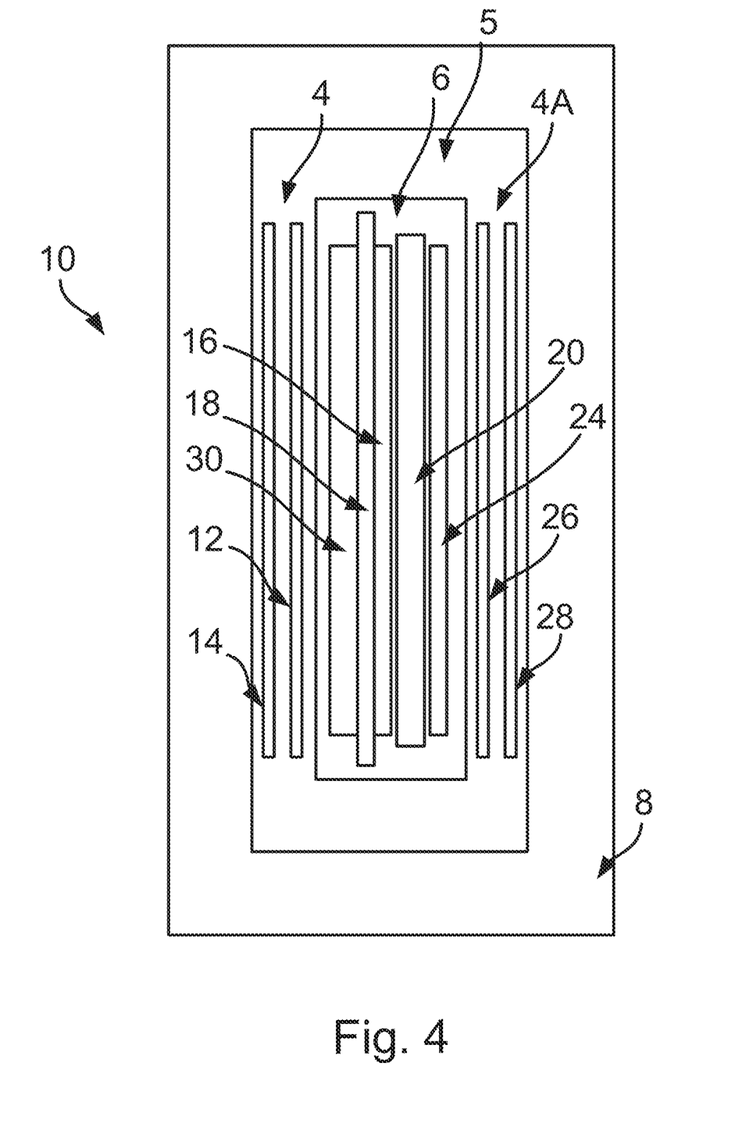
FIG. 4 shows the layout of an electrostatic discharge protection device including a silicon controlled rectifier in accordance with an embodiment of the present disclosure.

FIG. 1 shows an ESD protection device 10 comprising a silicon controlled rectifier in accordance with a first embodiment of this disclosure. The layout of the device 10 of FIG. 1 is shown in FIG. 4.

The device 10 includes a semiconductor substrate 8, which may be a silicon substrate and which may be p-doped. A first n-type region 4 is located in the substrate 8. A first p-type region 6 is also located in the substrate 8. As shown in FIG. 1, the first p-type region 6 is located adjacent the first n-type region 4. The first n-type region 4 and the first p-type region 6 may be formed in the substrate 8 using conventional semiconductor manufacturing techniques such as ion implantation and diffusion.

The device 10 includes a number of contact regions. For instance, an n-type contact region 14 and a p-type contact region 12 are located in the first n-type region 4. As is known in the art of ESD protection devices including silicon controlled rectifiers, the p-type contact region 12 in the first n-type region 4 may form an anode of the silicon controlled rectifier. Contact regions are also provided in the first p-type region. As shown in FIG. 1, these contact regions may include an n-type contact region 16 and a p-type contact region 24. Again, it will be appreciated that the n-type contact region 24 in the first p-type region 6 can form a cathode of the silicon controlled rectifier. Again, the various contact regions of the device can be manufactured using standard techniques such as ion implantation and diffusion.

Typically, the contact regions have a higher doping level ($n^+$, $p^+$) than the n-type and p-type regions within which they are located. The first p-type region 6 may only be lightly doped ($p^-$).

The device further includes a blocking region 20. The blocking region 20 is located in the first p-type region 6. More particularly, the blocking region 20 is located between the n-type contact region 16 and the p-type contact region 24 in the first p-type region 6. In the present embodiment, the blocking region 20 divides the first p-type region 6 into two parts, a first part of which contains the n-type contact region 16 and a second part of which contains the p-type contact region 24.

The blocking region 20 has a higher electrical resistivity than the first p-type region 6 within which it is located. The higher resistivity of the blocking region may be implemented in a number of ways. For instance, the blocking region 20 may have a lower doping level than the surrounding p-type material of the first p-type region 6, or indeed may be undoped. Combined with the doping conditions of the n-type layer 2 beneath it (to be described in more detail below), the p-type area in the blocking region may be narrowed in height (the remaining part being lightly n-doped due to the process steps in involved in forming the n-type layer 2). The narrowed p-type channel in blocking region 20 may have an even further increased resistance compared to a region which is completely p-type. It is also envisaged that the resistance of the blocking region 20 may be varied by varying a width of the blocking region (measured along the dimension extending between the n-type contact region 16 and the p-type contact region 24 in the first p-type region 6 (as indicated by the arrow in FIG. 1 labelled 17)). It is envisaged that the width of the blocking region 20, may be in the range 1 µm≤W≤2 µm.

The provision of the blocking region 20 can lower the trigger voltage of the SCR since the resistance between the area where avalanching occurs (as the SCR activates) and the p-type contact region 24 in the first p-type region 8 is increased. Due to the increased resistance provided by the blocking region 20, for a given current (comprising charge carriers created by avalanching during activation of the SCR) through the blocking region 20, there would be a higher potential across the blocking region 20, whereby the potential below the n-type contact region 24 is increased. This may lower the trigger voltage of the SCR.

In the present example, the first n-type region 4 is located at a first side of the first p-type region 6. FIG. 1 also shows that a second n-type region 4A may be provided on a second side of the first p-type region, opposite the first side. With reference to FIG. 4, it can be seen the first n-type region 4 and the second n-type region 4A may be comprised of portions of an n-type region 5 which surrounds a periphery of the first p-type region 6.

The second n-type contact region 4A can also include contact regions. In this example, the second n-type region 4A includes an n-type contact region 28 and a p-type contact region 26. This arrangement can provide a pnp action during an ESD event. In particular, the p-type contact region 26 can form an emitter for the pnp action, the second n-type region 4A can provide the base and the p-type region 6 (and contact region 24) can form the collector.

In the present embodiment, an n-type layer 2 (which may, for instance, comprise a deep n-well or buried well) may be provided beneath the first p-type region 6 of the device 10. This n-type layer 2 may, in combination with the n-type region 5, isolate the first p-type region 6 from the underlying substrate 8. The n-type layer 2 may also provide a current path through the device 10 as explained below. As shown in FIG. 1, the blocking region 20 may extend completely through the first p-type region 6 to reach the n-type layer 2. In this way, a current passing from the region of the device 10 in which avalanching occurs to the p-type contact region 24 may be forced to flow through the blocking region 20 (and cannot, for instance bypass the blocking region 20 by flowing beneath it).

As shown in FIG. 1, the first p-type region 6 can further include a further n-type contact region 30 for forming an npn transistor within the first p-type region 6. In particular, the n-type contact region 16 may form the source of the transistor and the further n-type contact region 30 may form the drain. The n-type contact region 30 may be provided with a silicide block 32. The transistor may further comprise a gate 18 for applying a potential to the portion of the first p-type region 6 that is located in between the n-type contact region 16 and the further n-type contact region 30.

FIG. 4 shows the layout of a device 10 of FIG. 1. As shown in FIG. 4, the first p-type region 6 is located adjacent the first n-type region 4 and may be peripherally surrounded of the n-type region 5 that incorporates the first n-type region 4. FIG. 4 also shows that the various contact regions 12, 14, 16, 24, 26, 28, 30, and the gate 18 may be provided in the form of strips running along a length of the first and second n-type regions 4, 4A and the firth p-type region 6.

Figure 2:
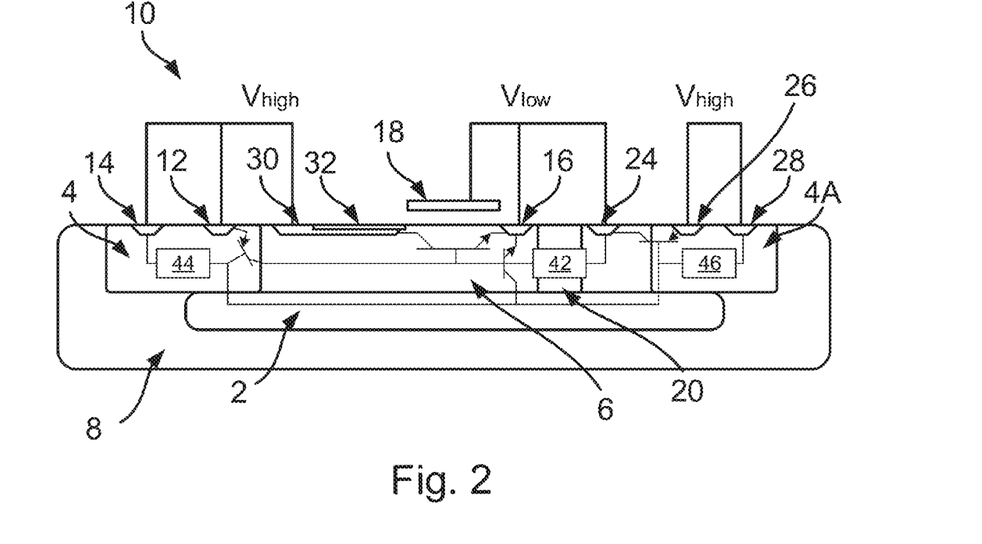
FIG. 2 shows an electrostatic discharge protection device including a silicon controlled rectifier in accordance with an embodiment of the present disclosure.

FIG. 2 shows the device of FIG. 1 with a schematic overlay indicating the parasitic bipolars of the device, which are active once the device 10 has been triggered. FIG. 2 further represents the electrical resistances provided within the first n-type region 4 (denoted by reference numeral 44), the second n-type region 4A (denoted using reference numeral 46) and the blocking region 20 (denoted using reference numeral 42). The parasitic bipolars and electrical resistances shown in FIG. 2 are summarised also in the circuit of FIG. 3, which will be explained in more detail below.

FIG. 2 further shows the connections to the various contact regions of the device 10. In particular, the contact regions 12, 14, 26, 28, 30 may all be connected to a first node of the device 10. The first node may, for example, be an I/O pad, and the device 10 may provide ESD protection for an output stage of an integrated circuit. The contact regions 16, 24 may be connected to a second node of the device, which may be a ground rail or grounded pin. The gate 18 may also be connected to the second node, or alternatively may be connected to a trigger circuit. It is envisaged that the first node would, during normal operation, operate at a higher potential than the second node and this is indicated in the drawings by the voltages "$V_{high}$" and "$V_{low}$" respectively.

Since the gate 18 in this example is connected to a low potential (Vl.), and the contact region 30 is connected to a high potential ($V_{high}$), large electric fields may occur between the contact region 30 and gate 18. It is therefore that at this particular location that avalanching may take place during triggering of the device 10. Properties of the gate 18, like its thickness, may affect the electric field. Therewith the voltage at which avalanching starts (and triggering occurs) may be controlled by altering the configuration of the gate 18.

During operation, in an ESD event, the SCR of the device may be triggered by avalanching that occurs near to the gate 18 and the further n-type contact region 30. The avalanching current increases strongly with increasing electric field (and with voltage if the gate voltage is kept constant). Triggering of the device may occur when the potential near the n-type contact region 16 is increased such that its pn junction (i.e. the junction between the n-type contact region 16 and the first p-type region 6) starts to conduct. In order to lower the trigger voltage (given the same potential near the n-type contact region 16 to trigger), a strongly increased resistance to the p-type contact region 24 is required. In accordance with embodiments of the disclosure, this strongly increased resistance is embedded in the structure via blocking region 20. As described above, a strongly increased resistance may result from the 'pinching action' of the underlying layer 2: only a fraction of the height of blocking region 20 may be p-type. Moreover, the p-type doping level may be lower than the doping level of the first p-type region 6, which may also increase the resistivity of the blocking region 20. In addition, the resistance of the blocking region 20 may be varied by altering the width of blocking region 20.

Figure 3:
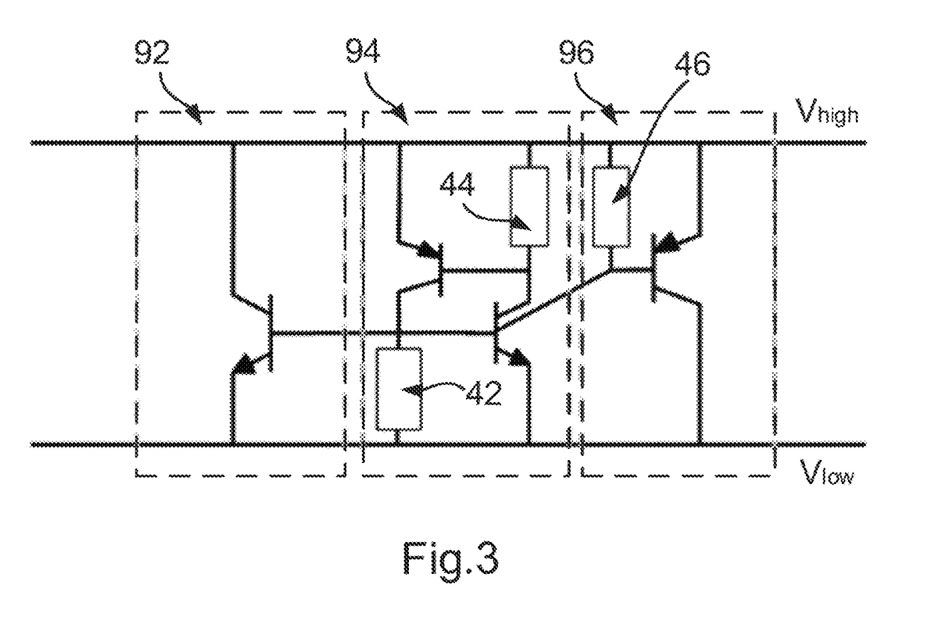
FIG. 3 shows an equivalent circuit of an electrostatic discharge protection device in accordance with an embodiment of the present disclosure.

With continued reference to FIGS. 2 and 3, once the silicon controlled rectifier of the device 10 is triggered, there are three main current paths within the device. The components forming these three current paths are schematically indicated by the dashed boxes labelled 92, 94, 96 in FIG. 3.

The current path through the silicon controlled rectifier is represented by the components contained within the dashed box 94 in FIG. 3. This current path is formed by the current from the n-type contact region 16 flowing into the n-type layer 2 in the substrate 8 and then running to high potential through the first n-type region 4 (and the contact regions 12, 14 thereof). In this respect, the potential drop within the first n-type contact region 4, due to the resistance of the first n-type contact region 4 (denoted in FIG. 2 by reference numeral 44), ensures that the pnp bipolar transistor formed by the contact region 12, the first n-type region 4 and the first p-type region 6 (this pnp bipolar is represented schematically adjacent the contact region 12 in FIG. 2) also opens, which results in a self-amplifying loop, which is characteristic for silicon controlled rectifiers.

A second current path (denoted by the dashed box labelled 92 in FIG. 3) within the device 10 is formed by the npn transistor formed by the contact regions 16, 30 and the gate 18. The presence of this NMOS device can ensure that the device is sufficiently quick to respond to very fast stress signals such as CDM discharges.

The third current path 96 (denoted by the dashed box labelled 96 in FIG. 3) includes the components of the second n-type region 4A. These components form an embedded pnp bipolar transistor as explained above, which may be triggered by a current running through the resistance of the second n-type region 4A (denoted using reference numeral 46 in FIG. 2). This may provide additional shunting capacity for the device.

Thus, a device 10 according the present disclosure, which includes the blocking region 20, may provide multiple current paths for current flow during an ESD event. These multiple paths may reduce the heating associated with current flow within any particular current path, which may in turn improve the robustness of the device 10 (by increasing the failure current). The resistances 42, 44, 46 may be tuned to determine how much current is taken by each of the current paths explained above in relation to FIG. 3. They may also influence the holding voltage of the device.

As described herein, the resistance provided by the blocking region 20 within the first p-type region 6 (denoted using reference numeral 42 in FIGS. 2 and 3) can modify (typically, reduce) the trigger voltage of 10 device. It is envisaged that by tuning the resistance of the blocking region 20, the trigger voltage may thus be tuned. As already noted above, the resistance of the blocking region 20 may be varied by varying a doping level of the blocking region. Another way in which the resistance of the blocking region 20 may be tuned is to vary the width of the blocking region 20 (by which it is meant the dimension of the blocking region 20 along a dimension extending between the contact regions 16, 24—this is indicated schematically by the arrow labelled 17 in FIG. 1). As also noted above, the doping associated with the layer 2 may cause the blocking region 20 to be narrowed ("pinched"). Thus it may further be possible to tune the resistance of the blocking region 20 by varying the doping profile of the layer 2. A doping profile (of the layer 2) which is narrow (in height) may lead to mild narrowing/pinching action in blocking region 20 and a relatively small resistance increase, while a doping profile which is more spread out (in height) may lead to stronger narrowing/pinching action, yielding a higher resistance of blocking region 20.

In general, a larger width for the blocking region 20 would result in a decreased trigger voltage for the device 10, while a narrower width for the blocking region 20 would result in a correspondingly higher trigger voltage for the device 10. Accordingly, the provision of the blocking region 20 within the first p-type region 6 of the device conveniently may allow for the trigger voltage of a device of the kind described herein to be tuned for a particular application. It is envisaged that the thickness of the gate 18, which would affect the avalanching behaviour of the device, may also influence the trigger voltage of the device.

It is further envisaged that the width of the blocking region 20 may also influence the holding voltage of the silicon controlled rectifier, thereby to tune the holding voltage to a level above the operating voltage for providing latch-up protection. These include:

The effective resistance of the blocking region 20 (which for example can be tuned by varying its width), which in addition to allowing control over the trigger voltage, may also influence the holding voltage of the device 10.

The length of the gate 18 between the contact regions 16 and 32.

The value of the resistance of the first n-type region 4 (denoted using reference numeral 44), which may be varied by varying the distance between the contact regions 12, 14 and/or by varying the amount of overlap between the n-type layer 2 and the first n-type region 4.

The value of the resistance associated with the further n-type contact region 4A (denoted using reference numeral 46), which may be varied in a manner similar to that mentioned above in relation to the resistance 44 (e.g. by varying the distance between the contact regions 26, 28 and/or by varying the amount of overlap between the n-type layer 2 and the second n-type region 4A).

The width of the contact region 30 in the first p-type region 6. Note that the n-type contact region 32 may be partially unsilicided and may overlap with the first n-type region 4 in some embodiments.

From the above, it will be appreciated that there are a significant number of parameters for varying both the trigger voltage and holding voltage of a device of the kind described herein. Moreover, by embedding multiple current shunting paths within a device of the kind described herein, with their relative strengths determined by independent parameters such as those noted above, it is possible to allow for independent control over the trigger voltage, holding voltage and leakage current of a device according to embodiments of this disclosure.

A device according to embodiments of this disclosure may also have a relatively low leakage current. One of the main issues for conventional ESD solutions that are used to protect thin gate oxide devices is the high leakage. A 'standard' solution is an ESD protection device with the same gate oxide thickness as the thin gate oxide of the MOS device that is to be protected. Embodiments of this disclosure may allow for the usage of a thicker gate oxide in combination with the blocking layer 20, allowing a trigger voltage comparable to a 'standard' thin gate oxide protection. Thicker gate oxides have the advantage of much less leakage.

It is further envisaged that the leakage current of a device described herein can be tuned by varying parameters such as those noted above. For instance, the leakage of the device may be reduced by increasing the length of the gate 18. Moreover, a change in holding voltage, induced by such an increase in the gate length, may be cancelled by tuning the other parameters noted above, such as:

The value of the resistance of the first n-type region 4 (denoted using reference numeral 44), which may be varied by varying the distance between the contact regions 12, 14 and/or by varying the amount of overlap between the n-type layer 2 and the first n-type region 4.

The value of the resistance associated with the further n-type contact region 4A (denoted using reference numeral 46), which may be varied in a manner similar to that mentioned above in relation to the resistance 44 (e.g. by varying the distance between the contact regions 26, 28 and/or by varying the amount of overlap between the n-type layer 2 and the second n-type region 4A).

Figure 5A:
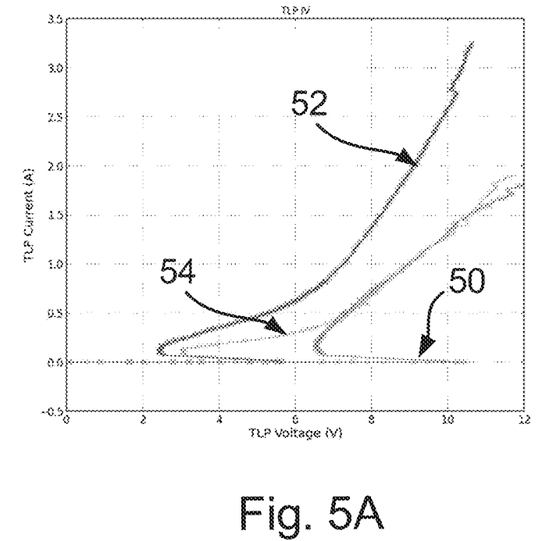
FIGS. 5A and 5B transmission line pulse data in accordance with an embodiment of the present disclosure.
Figure 5B:
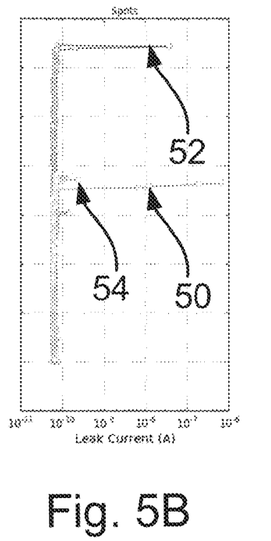

FIGS. 5B and 6B show the results of transmission line pulse (TLP) data for an ESD protection device of the kind described above in relation to FIGS. 1 to 4. The leakage current plot shown in FIGS. 5B and 6B were performed at 5.5 volts.

In FIGS. 5A and 5B:

plot 52 corresponds to an embodiment of the kind shown in FIG. 1 including the optional p-type contact region 26 shown in FIG. 1;

plot 54 corresponds to a similar device, which does not have this optional contact region 26 (although the second n-type region 4A and contact 28 are still present); and for comparison, plot 50 corresponds to a modified ggNMOS device with an added p-well block layer of the same width as that used for the plots 52 and 54. Note that the ggNMOS did not have a deep buried n-well layer 2 of the kind described above below the added p-well block area.

Each of the devices tested in FIGS. 5A and 5B have the same gate oxide thickness and the same layout of the drain of the embedded NMOS (formed by the contact region 30) and one can therefore expect that each device would have comparable avalanching behaviour at the gate.

As can be seen in FIG. 5A, plots 52 and 54 demonstrate a substantially reduced trigger voltage compared to the modified ggNMOS of plot 50. The observed trigger voltage of 5.7 volts of the proposed silicon controlled rectifier is below the holding voltage of the parasitic bipolar of the typical NMOS gate length (6.7 volts) and is also above the typical maximum operating voltage for the technology using this gate oxide (5.5 volts). In this way, in accordance with embodiments of this disclosure, triggering of an NMOS driver to be protected may be avoided, while also not disturbing regular functional operation.

In addition to this, comparison of plots 52 and 54 in FIG. 5B shows that the provision of the optional contact region 26 described above in relation to FIG. 1 can significantly increase the failure current (It2) of a device of the kind described herein (3.3 A vs. 1.9 A).

Embodiments of this disclosure may be used in a wide range of applications.

Figure 6:
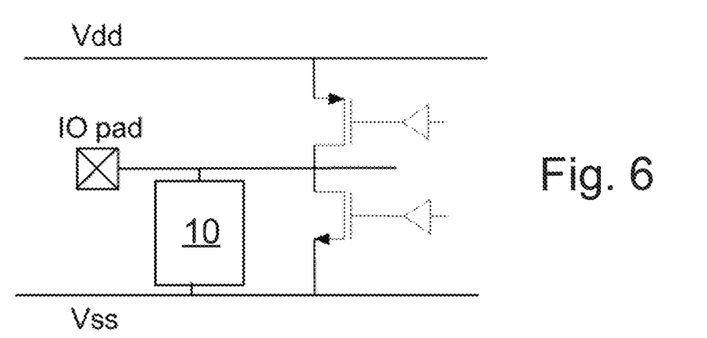
FIG. 6 shows a circuit including an electrostatic discharge protection device in accordance with an embodiment of the present disclosure.
Figure 7:
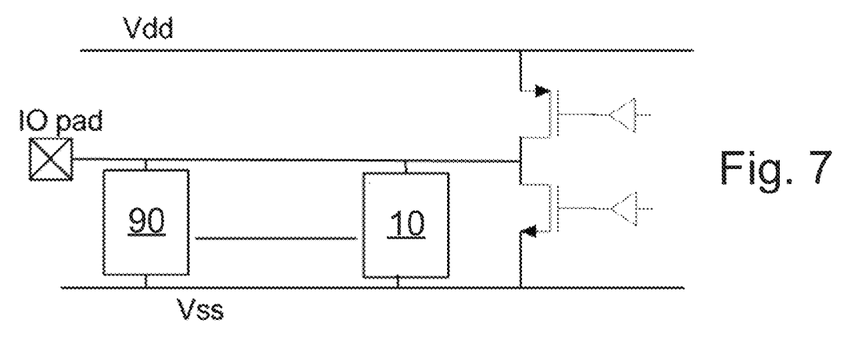
FIG. 7 shows a circuit including an electrostatic discharge protection device in accordance with an embodiment of the present disclosure.

FIG. 6 shows a circuit including a device 10 of the kind described above to protect an I/O output stage. In the example of FIG. 7, the device 10 may be connected between an I/O pad and a rail $V_{ss}$ (for example a ground rail) for protecting the output stage (represented by the combination of NMOS/PMOS transistors also shown in FIG. 6). FIG. 7 shows a modification of the circuit shown in FIG. 7 in which trigger/slew rate detection circuitry 90 is used, which circuitry may be connected to the gate 18 of the device 10 as described above.

Figure 8:
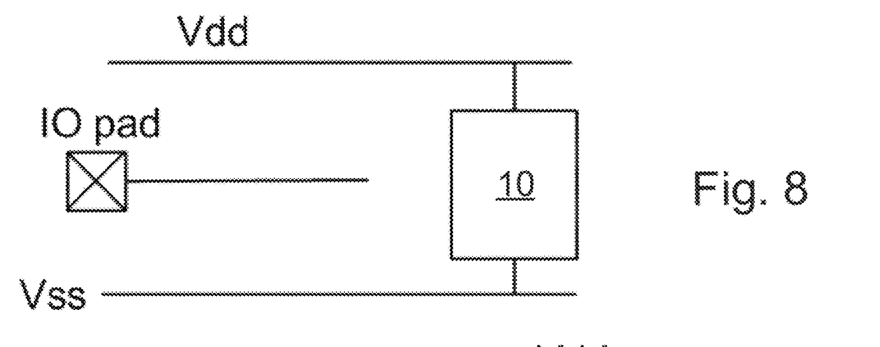
FIG. 8 shows a circuit including an electrostatic discharge protection device in accordance with an embodiment of the present disclosure.
Figure 9:
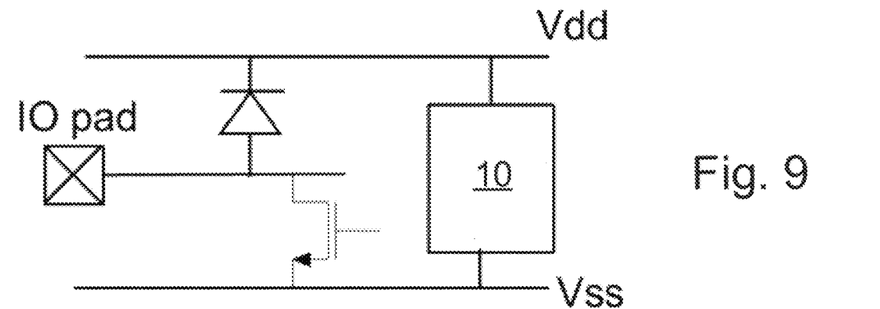
FIG. 9 shows a circuit including an electrostatic discharge protection device in accordance with an embodiment of the present disclosure.
Figure 10:
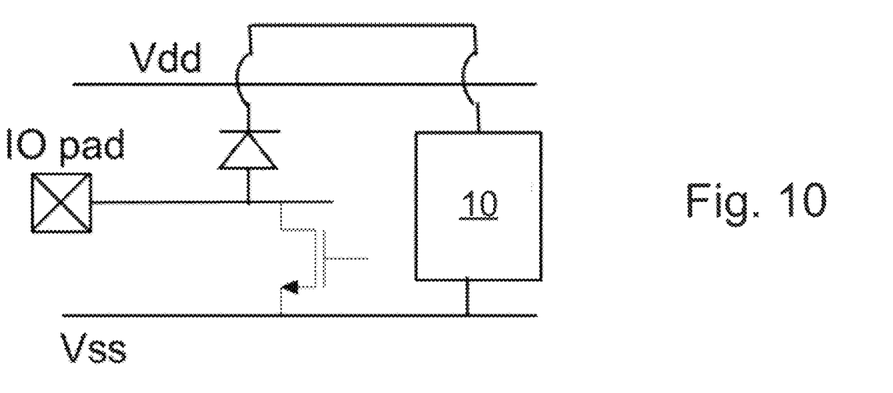
FIG. 10 shows a circuit including an electrostatic discharge protection device in accordance with an embodiment of the present disclosure.

A device according to an embodiment of this disclosure may also be used as protection for a power supply line. Examples of this are shown in FIGS. 8-10, in which the device 10 is connected between a first rail $V_{dd}$ (the power supply line) and a second rail $V_{ss}$ (for instance a ground rail) for shunting an ESD current from the first rail to the second rail during an ESD event.

Embodiments of this disclosure may allow a single device to protect both the IO pads and the power supply line of an integrated circuit using a single ESD protection device by careful engineering of the trigger voltage as described above. An example of this is shown in FIG. 9. FIG. 10 shows a similar example as that shown in FIG. 10, but with a floating line.

Figure 11:
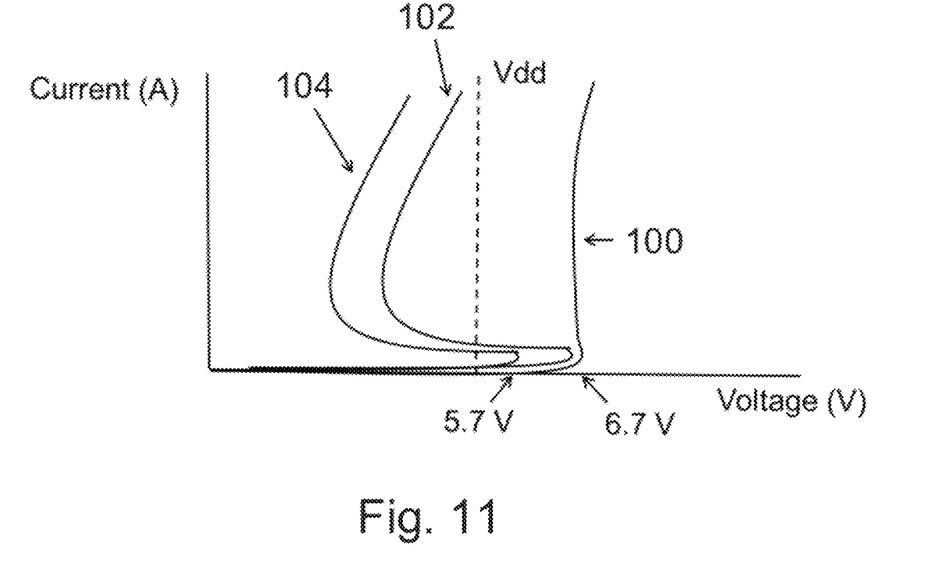
FIG. 11 shows the tuning of the trigger voltage of an electrostatic discharge protection device in accordance with an embodiment of the present disclosure.

Embodiments of this disclosure may allow the creation of a rail clamp that need not include a trigger circuit, which may substantially reduce the area occupied by the clamp on an integrated circuit. This may be achieved by careful engineering of the trigger voltage of the device as illustrated in FIG. 11. In FIG. 11:

plot 100 shows the trigger behaviour of an NMOS driver to be protected, at the lowest possible voltages, when the gate of the NMOS is high;

plot 104 shows the trigger behaviour of a device according to an embodiment of this disclosure; and plot 102 shows the sum of the trigger voltage (of plot 104) and the voltage drop from the diode (see FIG. 9) and the bus resistance.

By tuning the trigger voltage as described herein, the trigger voltage may be chosen such that it is above the maximum operating voltage Vdd (see plot 104), and also such that the sum of the trigger voltage and the voltage drop from the diode and the bus resistance (see plot 106) falls below the holding voltage of the NMOS driver to be protected (see plot 100).

Figure 12:
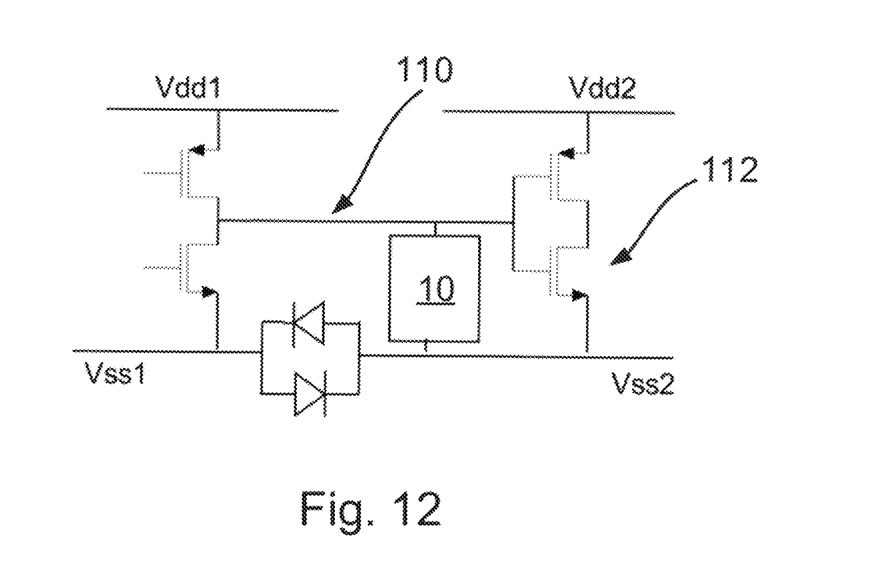
FIG. 12 shows a circuit including an electrostatic discharge protection device in accordance with an embodiment of the present disclosure.

Embodiments of this disclosure may further be used as a charged device model (CDM) clamp. An example of this is shown in FIG. 12. In the example of FIG. 12, the device 10 is coupled between a signal line 110 and a ground rail (Vss), to allow an ESD current to be shunted away from the NMOS and PMOS devices 112.

Accordingly, there has been described an electrostatic discharge protection device including a silicon controlled rectifier, an electrostatic discharge protection circuit including the electrostatic discharge protection device and an integrated circuit including the electrostatic discharge protection circuit. In one example, the silicon controlled rectifier includes a first n-type region located in a semiconductor substrate. The silicon controlled rectifier also includes a first p-type region located adjacent the first n-type region in the semiconductor substrate. The silicon controlled rectifier further includes an n-type contact region and a p-type contact region located in the first n-type region. The silicon controlled rectifier also includes an n-type contact region and a p-type contact region located in the first p-type region. The silicon controlled rectifier further includes a blocking region having a higher resistivity than the first p-type region. The blocking region is located between the n-type contact region and the p-type contact region in the first p-type region for reducing a trigger voltage of the silicon controlled rectifier.

Although particular embodiments of the present disclosure have been described, it will be appreciated that many modifications/additions and/or substitutions may be made within the scope of this disclosure.

The invention claimed is:

1. An electrostatic discharge protection device comprising a silicon controlled rectifier, the silicon controlled rectifier comprising:
a first region having a first conductivity type located in a semiconductor substrate;
a second region having a second conductivity type located adjacent the first region having the first conductivity type in the semiconductor substrate;
a third region having the first conductivity type located adjacent the second region having the second conductivity type in the semiconductor substrate, wherein the second region is between the first region and the third region;
a first contact region of the first conductivity type and a second contact region of the second conductivity type located in the first region having the first conductivity type;
a third contact region of the first conductivity type and a fourth contact region of the second conductivity type located in the second region having the second conductivity type;
a fifth contact region of the first conductivity type and a sixth contact region of the second conductivity type located in the third region having the first conductivity type; and
a blocking region having a higher resistivity than the region having the second conductivity type, wherein the blocking region is located between the third contact region of the first conductivity type and the fourth contact region of the second conductivity type in the second region having the second conductivity type, for reducing a trigger voltage of the silicon controlled rectifier.

2. The electrostatic discharge protection device of claim 1, wherein:
the first contact region of the first conductivity type and the second contact region of the second conductivity type located in the first region having the first conductivity type are connected to a first node of the device, and
the fifth contact region of the first conductivity type and the sixth contact region of the second conductivity type located in the third region having the first conductivity type are also connected to said first node.

3. The electrostatic discharge protection device of claim 2, wherein the first node comprises a power supply rail or I/O pad of the device.

4. The electrostatic discharge protection device of claim 2, wherein the third contact region of the first conductivity type and the fourth contact region of the second conductivity type located in the second region having the second conductivity type are connected to a second node of the device.

5. The electrostatic discharge protection device of claim 4, wherein the second node is a ground rail of the device.

6. The electrostatic discharge protection device of claim 1 comprising a seventh contact region of the first conductivity type located in the second region having the second conductivity type, wherein the third contact region of the first conductivity type and the seventh contact region of the first conductivity type located in the second region having the second conductivity type form a bipolar transistor within the second region having the second conductivity type.

7. The electrostatic discharge protection device of claim 6 further comprising a gate for applying a potential to a portion of the second region having the second conductivity type located in-between the third contact region of the first conductivity type and the seventh contact region of the first conductivity type.

8. The electrostatic discharge protection device of claim 7, wherein the gate is connected to a slew rate detection circuit.

9. The electrostatic discharge protection device of claim 7, wherein the gate is connected to a node of the device that is also connected to the third contact region and the fourth contact region in the second region.

10. The electrostatic discharge protection device of claim 1 comprising an underlying layer having the first conductivity type extending beneath the second region having the second conductivity type in the substrate for isolating the second region having the second conductivity type from an underlying region of the substrate.

11. The electrostatic discharge protection device of claim 1, wherein the blocking region is undoped or has a lower doping level than the second region having the second conductivity type.

12. The electrostatic discharge protection device of claim 1, wherein a dimension W of the blocking region extending between the third contact region of the first conductivity type and the fourth contact region of the second conductivity type in the second region having the second conductivity type is in the range 1 µm≤W≤2 µm.

13. The electrostatic discharge protection device of claim 10, wherein the underlying layer having the first conductivity type further extends under a portion of the first region by a first overlap distance, wherein a resistance associated with the first region is based on the first overlap distance.

14. The electrostatic discharge protection device of claim 13, wherein the underlying layer having the first conductivity type further extends under a portion of the third region by a second overlap distance, wherein a resistance associated with the third region is based on the second overlap distance.

15. The electrostatic discharge protection device of claim 1, wherein
a first bipolar transistor is formed within the first region,
a second bipolar transistor is formed within the second region,
the first and second bipolar transistors have opposite conductivity types.

16. The electrostatic discharge protection device of claim 15, wherein
a third bipolar transistor is formed by the sixth contact region, the third region, and the second region,
the first and third bipolar transistors have same conductivity types.

17. An electrostatic discharge protection circuit comprising a silicon controlled rectifier, the silicon controlled rectifier comprising:
a first region having a first conductivity type located in a semiconductor substrate;
a second region having a second conductivity type located adjacent the first region having the first conductivity type in the semiconductor substrate;
a third region having the first conductivity type located adjacent the second region having the second conductivity type in the semiconductor substrate, wherein the second region is between the first region and the third region;
a first contact region of the first conductivity type and a second contact region of the second conductivity type located in the first region having the first conductivity type;
a third contact region of the first conductivity type and a fourth contact region of the second conductivity type located in the second region having the second conductivity type;
a fifth contact region of the first conductivity type and a sixth contact region of the second conductivity type located in the third region having the first conductivity type; and
a blocking region having a higher resistivity than the region having the second conductivity type, wherein the blocking region is located between the third contact region of the first conductivity type and the fourth contact region of the second conductivity type in the second region having the second conductivity type, for reducing a trigger voltage of the silicon controlled rectifier.

18. An integrated circuit comprising a silicon controlled rectifier, the silicon controlled rectifier comprising:
a first region having a first conductivity type located in a semiconductor substrate;
a second region having a second conductivity type located adjacent the first region having the first conductivity type in the semiconductor substrate;
a third region having the first conductivity type located adjacent the second region having the second conductivity type in the semiconductor substrate, wherein the second region is between the first region and the third region;
a first contact region of the first conductivity type and a second contact region of the second conductivity type located in the first region having the first conductivity type;
a third contact region of the first conductivity type and a fourth contact region of the second conductivity type located in the second region having the second conductivity type;
a fifth contact region of the first conductivity type and a sixth contact region of the second conductivity type located in the third region having the first conductivity type; and
a blocking region having a higher resistivity than the region having the second conductivity type, wherein the blocking region is located between the third contact region of the first conductivity type and the fourth contact region of the second conductivity type in the second region having the second conductivity type, for reducing a trigger voltage of the silicon controlled rectifier.

* * * * *